United States Patent
Drader et al.

(10) Patent No.: US 10,267,901 B2
(45) Date of Patent: Apr. 23, 2019

(54) RANGING DEVICE WITH IMAGING CAPABILITY

(71) Applicant: STMicroelectronics (Grenoble 2) SAS, Grenoble (FR)

(72) Inventors: Marc Drader, Colombelles (FR); Pascal Mellot, Lans en Vercors (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 223 days.

(21) Appl. No.: 15/169,489

(22) Filed: May 31, 2016

(65) Prior Publication Data
US 2017/0139041 A1  May 18, 2017

(30) Foreign Application Priority Data
Nov. 16, 2015  (FR) ...................... 15 60949

(51) Int. Cl.
G01S 7/486 (2006.01)
H01L 27/144 (2006.01)
(Continued)

(52) U.S. Cl.
CPC ............ *G01S 7/4863* (2013.01); *G01S 7/487* (2013.01); *G01S 7/4865* (2013.01); *G01S 7/493* (2013.01); *G01S 7/4914* (2013.01); *G01S 7/4915* (2013.01); *G01S 17/10* (2013.01); *G01S 17/36* (2013.01); *H01L 27/1446* (2013.01)

(58) Field of Classification Search
CPC ..... G01S 7/4863; G01S 17/10; H01L 27/1446
See application file for complete search history.

(56) References Cited

U.S. PATENT DOCUMENTS 9,786,701 B2    10/2017  Mellot et al.
2011/0157354 A1*  6/2011  Kawahito ............. G01S 7/4863
                                                  348/140
(Continued)

FOREIGN PATENT DOCUMENTS

EP         2541219 A1    1/2013

OTHER PUBLICATIONS

Gersbach et al., "A Parallel 32×32 Time-To-Digital Converter Array Fabricated in a 130 nm Imaging CMOS Technology," IEEE Proceedings of ESSCIRC, Athens, Sep. 14-18, 2009, 4 pages.
(Continued)

*Primary Examiner* — Eric L Bolda
(74) *Attorney, Agent, or Firm* — Seed IP Law Group LLP (57) ABSTRACT

A ranging device includes an array of photon detection devices adapted to receive an optical signal reflected by an object in an image scene. First and second logic devices are adapted to respectively combine the outputs of first and second pluralities of the photon detection devices. A first range detection circuit is coupled to outputs of the first and second logic devices and a first counter is coupled to the output of the first logic device and adapted to generate a first pixel value by counting events generated by the first plurality of photon detection devices. A second counter is coupled to the output of the second logic device and is adapted to generate a second pixel value by counting events generated by the second plurality of photon detection devices. The first and second pixel values may be used in estimating a range to the object in the image scene.

20 Claims, 6 Drawing Sheets

(51) Int. Cl.
*G01S 17/10* (2006.01)
*G01S 17/36* (2006.01)
*G01S 7/487* (2006.01)
*G01S 7/491* (2006.01)
*G01S 7/493* (2006.01)

(56) References Cited

U.S. PATENT DOCUMENTS

| | | |
|---|---|---|
| 2012/0249998 A1 | 10/2012 | Eisele et al. |
| 2013/0077082 A1 | 3/2013 | Mellot |
| 2013/0175435 A1 | 7/2013 | Drader |
| 2014/0016879 A1* | 1/2014 | Hogasten ............... H04N 5/33 382/264 |
| 2014/0021356 A1 | 1/2014 | Zwaans et al. |
| 2014/0231631 A1 | 8/2014 | Moore et al. |
| 2015/0177369 A1 | 6/2015 | Kostamovaara |
| 2015/0312489 A1* | 10/2015 | Hoelter ................ H04N 5/33 348/164 |

OTHER PUBLICATIONS

Niclass et al., "A 128×128 Single-Photon Imager with on-Chip Column-Level 10b Time-to-Digital Converter Array Capable of 97ps Resolution," ISSCC 2008, Session 2, Image Sensors & Technology, 2.1, IEEE International Solid-State Circuits Conference, 2008, 3 pages.

Walker et al., "A 128×96 Pixel Event-Driven Phase-Domain ΔΣ-Based Fully Digital 3D Camera in 0.13 µm CMOS Imaging Technology," ISSCC 2011, Session 23, Image Sensors, 23.6, IEEE International Solid-State Circuits Conference, 2011, 3 pages.

* cited by examiner

RANGING DEVICE WITH IMAGING CAPABILITY

This application claims the priority benefit of French Patent application number 15/60949, filed on Nov. 16, 2015, the contents of which is hereby incorporated by reference in its entirety to the maximum extent allowable by law.

BACKGROUND

Technical Field

The present disclosure relates to the field of ranging based on a time of flight calculation, and in particular to a ranging device with imaging capabilities.

Description of the Related Art

SPAD (single-photon avalanche diode) arrays can be used for a variety of applications, including for ranging, for 2D or 3D gesture recognition and for 3D imaging. A device for such applications generally comprises a light source for transmitting an optical pulse into the image scene. The light reflected back from any object in the image scene is detected by the SPAD array, and used to determine the time of flight of the optical pulse. The distance from the object to the device can then be deduced based on this time of flight.

The detection by the SPAD array of the returning optical pulse is based on event detection in the cells of the SPAD array. In particular, each cell will provide an output pulse when a photon is detected, and by monitoring the events, the arrival time of the return pulse can be estimated.

A SPAD array comprising columns and rows of SPADs permits scene content to be captured in two dimensions by the array. The outputs of the SPADs are combined and provided to a phase detector in order to estimate the time of flight.

A difficulty is that, depending on the 2-dimensional scene content, some of the SPADs in the array may provide an output signal having a poor signal-to-noise ratio (SNR), leading to inaccuracies in the time of flight calculation.

There is a need in the art for a method and device for compensating for such pixels in a simple and efficient manner.

BRIEF SUMMARY

It is an aim of embodiments of the present description to at least partially address one or more problems in the prior art.

According to one aspect, there is provided a ranging device comprising: an array of photon detection devices adapted to receive an optical signal reflected by an object in an image scene; a first logic device adapted to combine the outputs of a first plurality of the photon detection devices; a second logic device adapted to combine the outputs of a second plurality of the photon detection devices; a first range detection circuit coupled to outputs of the first and second logic devices; a first counter coupled to the output of the first logic device and adapted to generate a first pixel value by counting events generated by the first plurality of photon detection devices; and a second counter coupled to the output of the second logic device and adapted to generate a second pixel value by counting events generated by the second plurality of photon detection devices.

According to one embodiment, the ranging device further comprises a control circuit adapted to select or deselect the output of the first logic device based on the first pixel value and to select or deselect the output of the second logic device based on the second pixel value.

According to one embodiment, the control circuit is adapted to compare the first pixel value with a first threshold level and to deselect the output of the first logic device if the first pixel value is lower than the first threshold level.

According to one embodiment, the first counter is adapted to: generate the first pixel value by counting events while the optical signal is transmitted into the image scene; generate a first ambient pixel value by counting events generated by the first plurality of photon detection devices while no optical signal is transmitted into the image scene; and generate a first signal to noise ratio based on the first pixel value and on the first ambient pixel value, and deselect the output of the first logic device if the first signal to noise ratio is lower than a second threshold level.

According to one embodiment, the first and second plurality of photon detection devices are part of a first zone of the array, the array further comprising a second zone, the ranging device further comprising: a third logic device adapted to combine the outputs of a third plurality of photon detection devices of said second zone; and a second range detection circuit coupled to an output of the third logic device.

According to one embodiment, the first range detection circuit comprises: a first counter circuit coupled to an output of the first logic device and adapted to generate a first count value by counting the photon detection events generated by the first plurality of photon detection devices; a second counter circuit coupled to an output of the second logic device and adapted to generate a second count value by counting the photon detection events generated by the second plurality of photon detection devices; and a range estimation circuit adapted to estimate the range of the object by estimating the timing of one or more pulses of said optical signal based on the first and second count values.

According to one embodiment, the first counter circuit is adapted to generate the first count value by counting the photon detection events generated by the first plurality of photon detection devices during a first time window, and to generate a third count value by counting the photon detection events generated by the first plurality of photon detection devices during a second time window consecutive to the first time window; and the second counter circuit is adapted to generate the second count value by counting the photon detection events generated by the second plurality of photon detection devices during the first time window and to generate a fourth count value by counting the photon detection events generated by the second plurality of photon detection devices during the second time window.

According to one embodiment, the ranging device further comprises: a first adder adapted to add the first and second count values to generate a first combined count value; and a second adder adapted to add the third and fourth count values to generate a second combined count value, the first range detection circuit being adapted to determine the timing of the one or more pulses of the optical signal based on the first and second combined count values.

According to one embodiment, the first range detection circuit is adapted to calculate the difference between the first and second combined count values, and to determine the timing of the one or more optical pulses based on said difference.

According to one embodiment, the first range estimation circuit comprises a sigma-delta phase detector.

According to one embodiment, the ranging device further comprises: an optical transmitter adapted to transmit the optical signal towards the object in the image scene.

According to one embodiment, the first and second logic devices are OR trees.

According to one embodiment, the photon detection devices are SPAD devices.

According to a further embodiment, there is provided a method comprising: receiving, by an array of photon detection devices, an optical signal reflected by an object in an image scene; combining, by a first logic device, the outputs of a first plurality of the photon detection devices; combining, by a second logic device, the outputs of a second plurality of the photon detection devices; generating, by a first counter coupled to the output of the first logic device, a first pixel value by counting events generated by the first plurality of photon detection devices; generating, by a second counter coupled to the output of the second logic device, a second pixel value by counting events generated by the second plurality of photon detection devices; and estimating, by a first range detection circuit coupled to outputs of the first and second logic devices, a range of the object.

According to one embodiment, the method further comprises: selecting or deselecting, by a control circuit, the output of the first logic device based on the first pixel value; and selecting or deselecting, by the control circuit, the output of the second logic device based on the second pixel value.

According to one embodiment, the optical signal is: a square-wave signal; or a sinewave signal; or a triangle wave signal; or a sawtooth wave signal.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the present description, the term "connected" is used to designate a direct electrical connection between two elements, whereas the term "coupled" is used to designate an electrical connection between two elements that may be direct, or may be via one or more other components such as resistors, capacitors or transistors. Furthermore, as used herein, the term "around" is used to designate a range of +/−10 percent of the value in question.

While in the present description embodiments are described comprising a ranging device in the form of a SPAD array, the principles of the circuit and method described herein for calculating a distance to an object could be applied to arrays formed of other types of photon detection devices.

Figure 1:
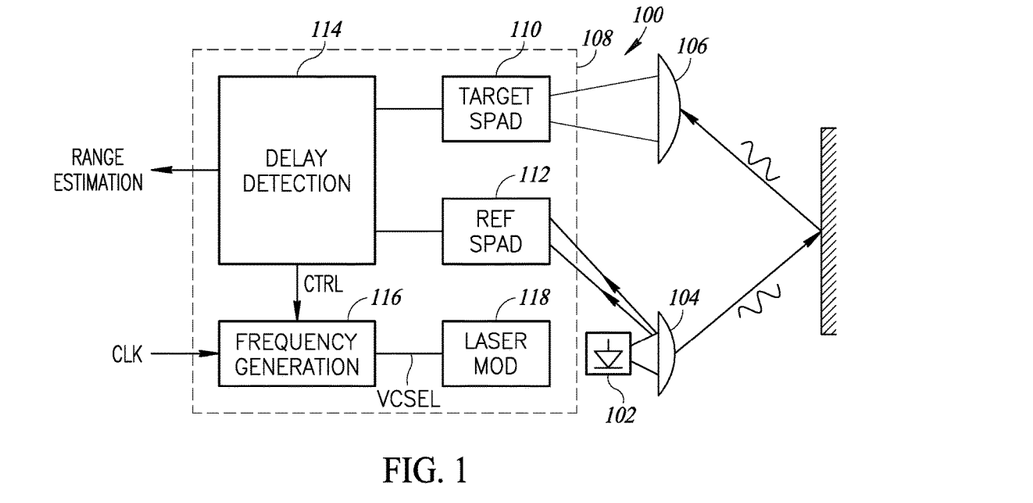
FIG. 1 schematically illustrates a SPAD device according to an example embodiment of the present disclosure.

FIG. 1 schematically illustrates a ranging device 100 implementing a ranging function. The device 100 comprises a light source 102, which is for example a laser, for generating an optical signal, formed for example of a beam of optical pulses, transmitted into the image scene, for example via a lens 104. The return optical pulses are for example received via a further lens 106.

The ranging device 100 further comprises a range estimation circuit 108 for estimating the distance between the device 100 and an object in the image scene against which the optical pulses reflect. The range estimation circuit 108 for example comprises a target SPAD array (TARGET SPAD) 110, which receives the return optical pulses via the lens 106. The target SPAD array 110 for example comprises an array of between 4 and several hundred SPAD cells.

The range estimation circuit 108 also for example comprises a reference SPAD array (REF SPAD) 112, which is for example of the same dimensions or of smaller dimensions than the target SPAD array 110, and receives an internal reflection of the transmitted optical pulses. In some embodiments, the reference SPAD array 112 is a mono-dimensional array, for example having only a row or column of SPAD cells.

A delay detection circuit (DELAY DETECTION) 114 is for example coupled to the target SPAD array 110 and to the reference SPAD array 112, and estimates the delay between each transmitted optical pulse and the return optical pulse received by the target SPAD array 110, in order to provide a range estimation (RANGE ESTIMATION) of the object. The range estimation circuit 108 also for example comprises a frequency generation circuit (FREQUENCY GENERATION) 116, which generates a voltage signal VCSEL provided to a laser modulation circuit (LASER MOD) 118 for generating a signal for driving the light source 102. The delay detection circuit 114 for example provides a control signal CTRL to the frequency generation circuit 116 for controlling the period of the signal VCSEL.

Figure 2:
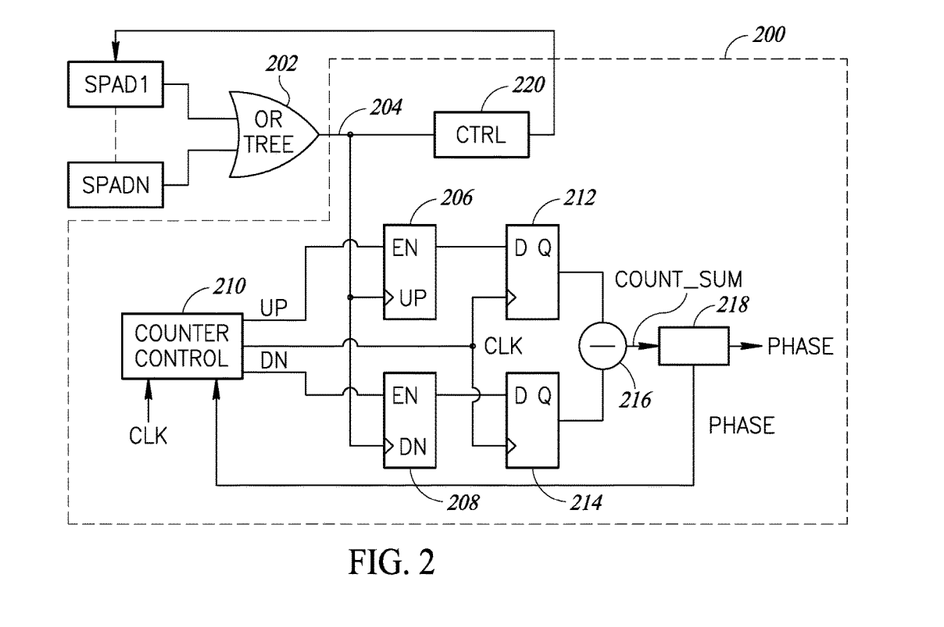
FIG. 2 schematically illustrates a delay detection circuit of FIG. 1 in more detail according to an example embodiment.

FIG. 2 schematically illustrates a circuit 200 forming part of the delay detection circuit 114 of FIG. 1 in more detail according to an example embodiment in which the outputs of all of the SPAD cells of the target SPAD array 110 are combined onto a single line. In particular, an OR tree (OR TREE) 202 has inputs respectively coupled to the output of each of the SPAD cells SPAD1 to SPADN of the target array 110, and provides, on its output line 204, pulses generated each time an event is detected by any of the SPAD cells.

The circuit 200 for example comprises counters, coupled to the output line 204, for counting the detected events. In the example of FIG. 2, the output line 204 is coupled to the clock input of an up counter (UP) 206 and of a down counter (DN) 208. The up counter 206 is enabled during an up count period, based on a signal UP received from a counter control circuit (COUNTER CONTROL) 210, which receives a clock signal CLK. Similarly, the down counter 208 is enabled during a down count period, based on a signal DN received from the counter control circuit 210. The output of the counter 206 is for example clocked by a flip-flop 212 based on the clock signal CLK, and the output of the counter 208 is for example clocked by a flip-flop 214 based on the clock signal CLK. A difference between the outputs of the flip-flops 212 and 214 is generated by a subtraction unit 216 to provide a signal COUNT_SUM. This signal is analyzed by a phase detection circuit 218, which is for example a sigma delta phase detector, in order to generate a phase signal (PHASE) indicating for example the timing of the center of each optical pulse received by the target SPAD array 110. The phase signal PHASE is provided to the counter control circuit 210 and used to determine the timing to be applied for a subsequent detection cycle. In particular, the phase signal is for example used to control the timing of the signals UP and DN, as will be described in more detail below.

While not illustrated in FIG. 2, the delay detection circuit 114 for example further comprises a circuit similar to the circuit 200 for generating a reference phase signal PHASE' indicating the timing of the center of each optical pulse received by the reference SPAD array 112. The delay detection circuit 114 for example estimates the time of flight of the optical pulses based on the time difference between the phase signals PHASE and PHASE'.

Figure 3:
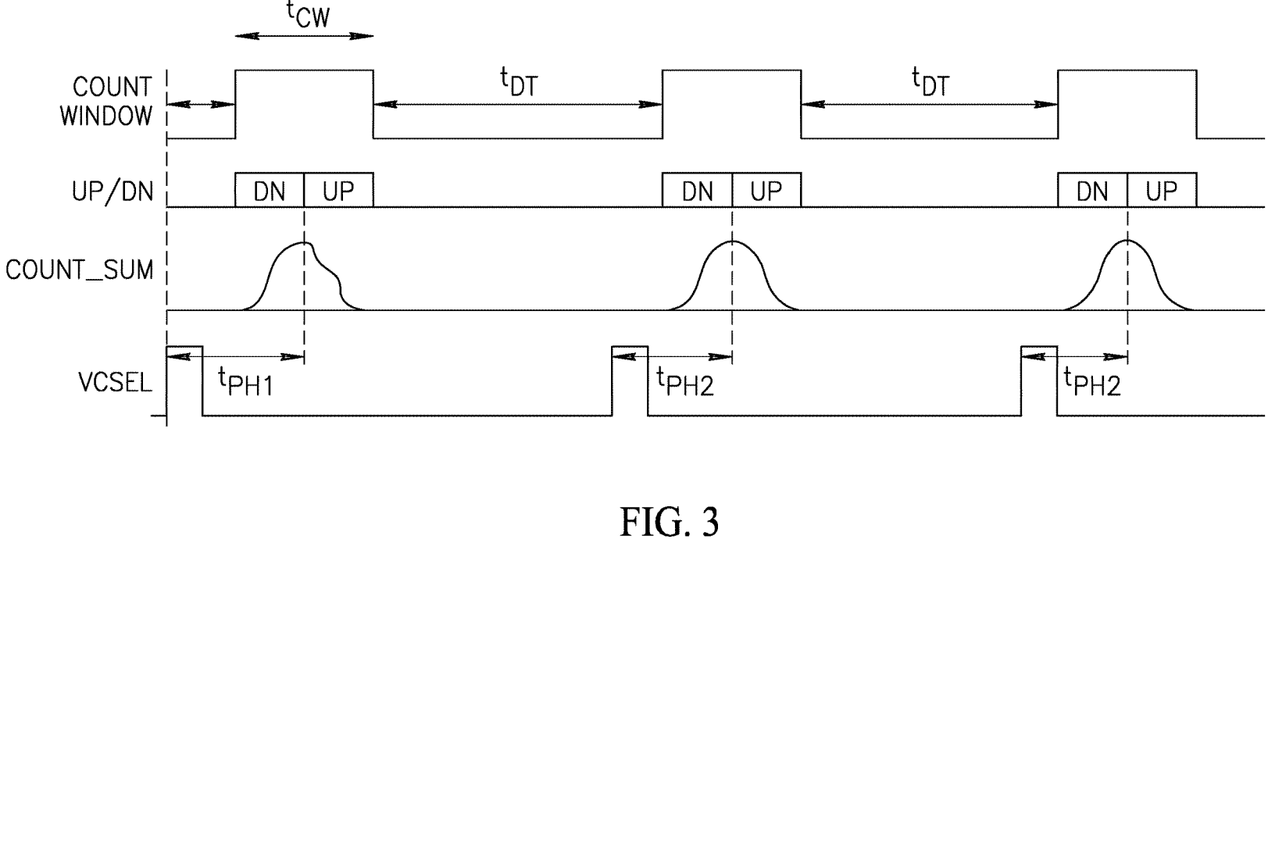
FIG. 3 is a timing diagram illustrating examples of signals in the circuit of FIG. 2 according to an example embodiment.

FIG. 3 is a timing diagram illustrating examples of a count window (COUNT WINDOW) of the counters 206, 208 of FIG. 2, and the signals DN and UP controlling the counters 206, 208, the signal COUNT_SUM and the signal VCSEL used to generate the optical pulses.

The count window for each detection phase for example has a duration $t_{CW}$, and the count windows are separated by deadtime periods of duration $t_{DT}$ during which the counters 206, 208 are disabled. The sum of the durations $t_{CW}$ and $t_{DT}$ is for example equal to the optical pulse period, in other words the period of the signal VCSEL.

The signal DN is for example asserted during the first half of the count window, and the signal UP is for example asserted during the second half of the count window. The signal VCSEL is for example the signal used to generate the transmitted optical pulses. The phase signal PHASE generated by the circuit 218 for example indicates the timing of the center of the count window for a subsequent returned optical pulse, based on the difference COUNT_SUM between the down and up counts. The phase signal PHASE' is for example generated in a similar fashion based on the timing of the center of the count window for reference optical pulses, and the difference in time between the phase signals PHASE and PHASE' is thus used to estimate the time of flight of the optical pulse from the image scene.

In the example of FIG. 3 the signal VCSEL is a square-wave signal, and the generated optical pulses for example also form a square-wave. However, in alternative embodiments, the signal VCSEL used to generate the optical pulses, and the optical pulses themselves, could have other forms. In some examples, the optical signal is a periodic optical signal. For example, the signal VCSEL and the optical pulses could form a continuous sinewave signal, having peaks that correspond to the optical pulses, and troughs in which the optical signal falls to zero. In such a case, the period of the optical pulse signal would be the period of the sinewave. As further examples, the signal VCSEL and the optical pulses could be in the form of triangle or sawtooth waves in which the peaks of these signals form the optical pulses. Of course, while the optical signal may be periodic, in some cases the period may vary from one cycle to the next, for example due to jitter, or because it has a varying pulse frequency over time.

Figure 4:
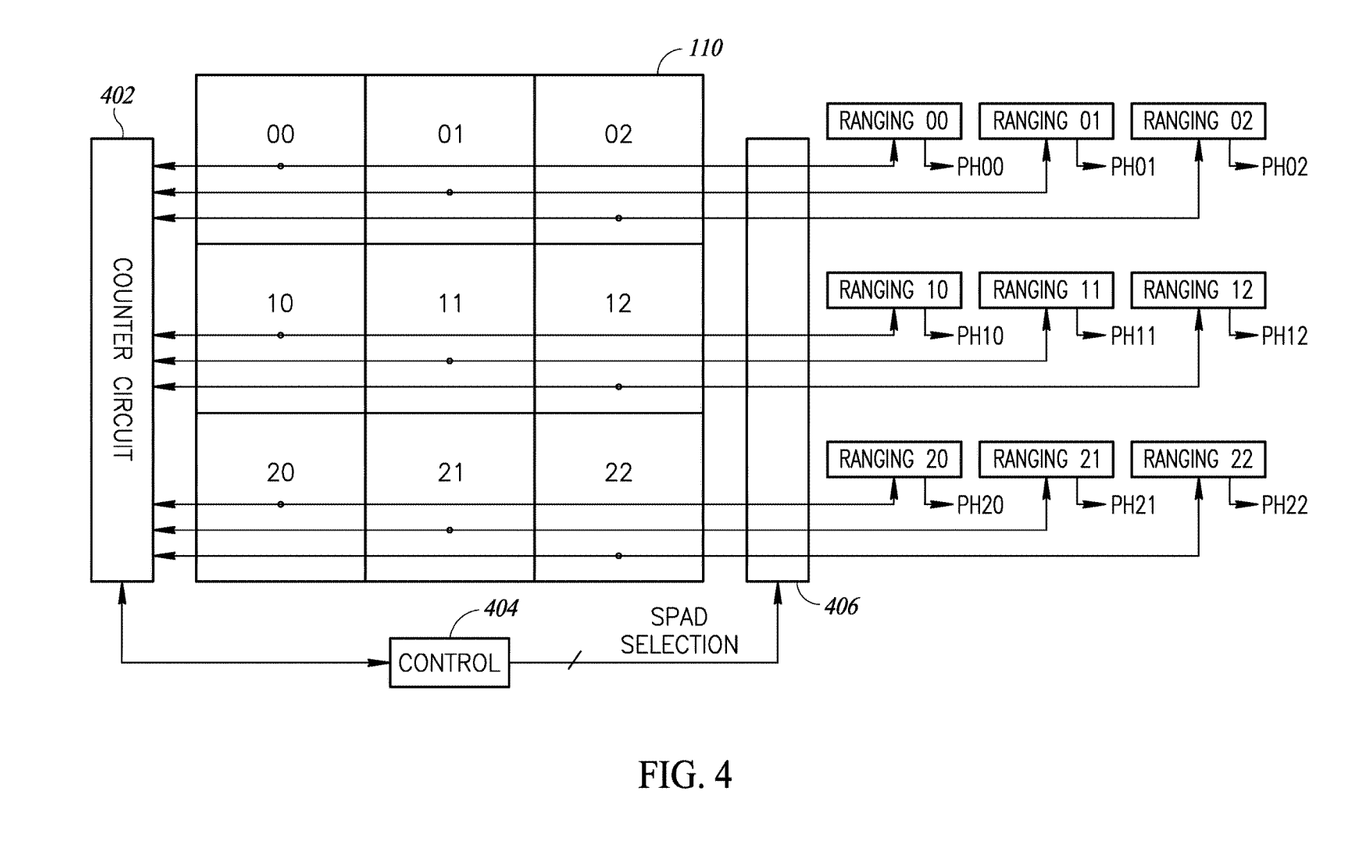
FIG. 4 schematically illustrates a target SPAD array and detection circuit of FIG. 1 in more detail according to an example embodiment of the present disclosure.

FIG. 4 schematically illustrates the target SPAD array 110 and part of the delay detection circuit 114 of FIG. 1 in more detail according to an alternative embodiment to that of FIG. 2.

The target SPAD array 110 for example comprises a plurality of zones. In the example of FIG. 4, the SPAD array 110 comprises nine zones arranged in three rows and three columns. The zones of the first row are labeled from left to right 00, 01 and 02, the zones of the second row are labeled from left to right 10, 11 and 12, and the zones of the third row are labeled from left to right 20, 21 and 22. Each of the zones for example comprises a plurality of SPADs.

A plurality of range estimation circuits for estimating the range of an object captured by the SPAD cells in each zone are for example provided, one range estimation circuit for example being provided for each zone of the SPAD array 110. The range estimation circuits for example permit the generation of a depth map formed of the values generated by each estimation circuit. For example, a range estimation circuit RANGING 00 is coupled to the outputs of the SPADs of the zone 00, a range estimation circuit RANGING 01 is coupled to the outputs of the SPAD cells of the zone 01, and so on and so forth, up to a range estimation circuit 22 coupled to the outputs of the SPADS of zone 22. Each of the range estimation circuits RANGING 00 to RANGING 22 is for example implemented by a circuit similar to the circuit 200 of FIG. 2, and for example generates a corresponding phase signal PHASE, these signals being labeled PH00 to PH22 in FIG. 4. However, other implementations are also possible, as described in more detail below.

The outputs of the SPAD cells of each zone 00 to 22 are also for example coupled to a counter circuit (COUNTER CIRCUIT) 402, comprising a plurality of counters for counting events generated by the SPAD cells of each zone. For example, the counter circuit 402 generates a 2D image, also referred to herein as a signal map, where each pixel of the map corresponds to a count value of the number of events detected by the SPADs of a zone or sub-zone of the array. The signal map can be used to selectively activate zones of the SPAD array in order to improve the accuracy of the range estimation. For example, zones for which the signal level is low can be deselected. Furthermore, the signal map can be used for other purposes, such as to aid an interpolation of a depth map to increase its resolution, or to aid movement or gesture detection.

A control circuit 404 is for example adapted to generate a SPAD selection signal (SPAD SELECTION) based on one or more pixels of the captured image. The SPAD selection signal is used to control a SPAD selection circuit 406 coupled between the output of the SPAD cells of each zone of the SPAD array 110 and the ranging devices RANGING 00 to RANGING 22. The SPAD selection circuit 406 for example comprises selection circuits for selecting the outputs of only certain SPAD cells or groups of SPAD cells in the array to be provided to the corresponding range estimation circuit.

Figure 5A:
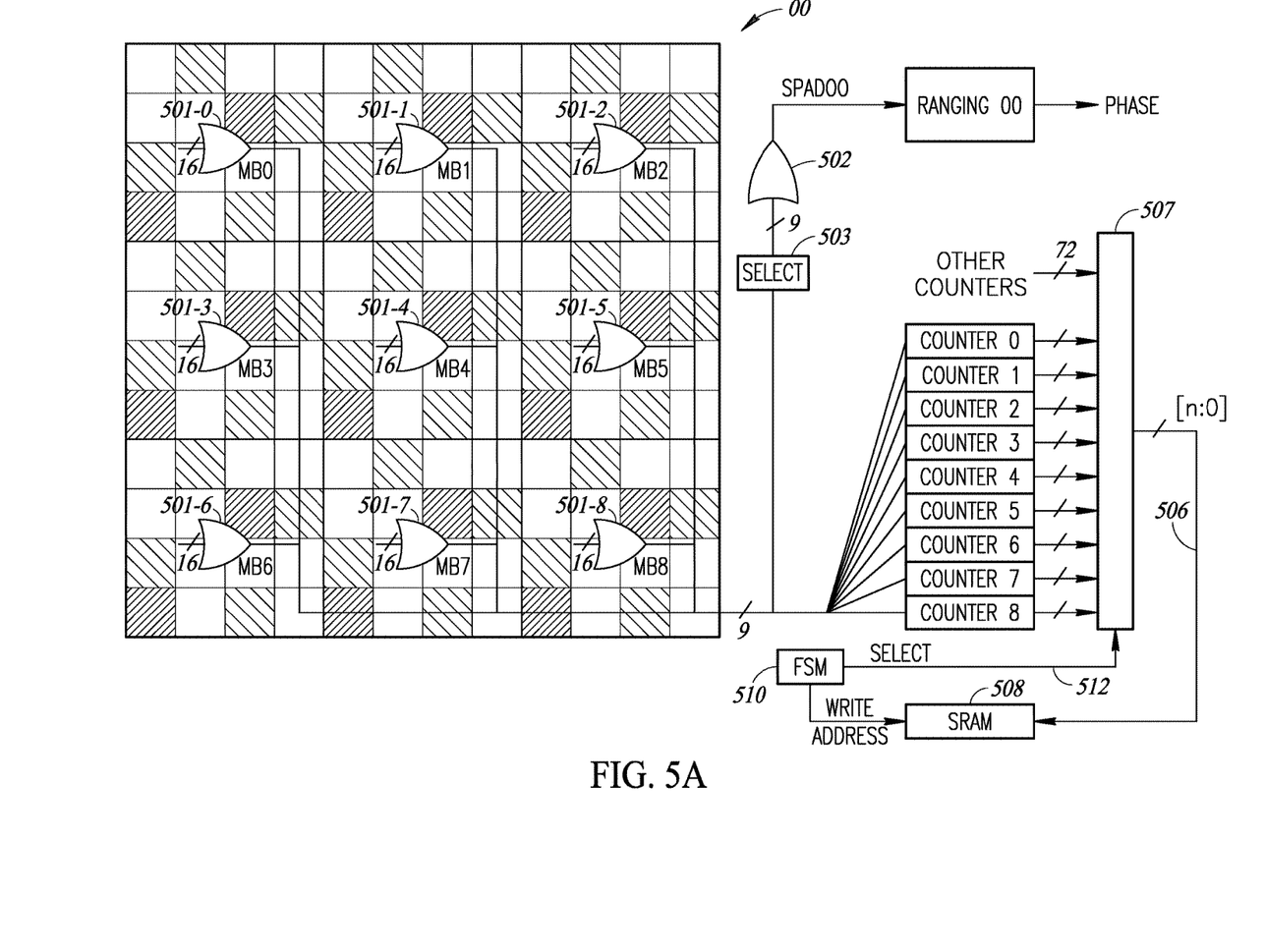
FIG. 5A schematically illustrates parts of the circuits of FIG. 4 in more detail according to an example embodiment.

FIG. 5A schematically illustrates the zone 00 of the array, the range estimation circuit 00, and part of the counter circuit 402 of FIG. 4 in more detail according to an example embodiment.

In the example of FIG. 5A, the zone 00 of the target SPAD array 110 comprises a 12 by 12 group of SPAD cells. The SPAD cells of the zone 00 are for example divided into macroblocks, each macroblock comprising 16 SPADs arranged in four rows and four columns. There are for example 9 macroblocks in each zone, arranged in three rows and three columns. Each of the other zones 01 to 22 of the array 110 for example has a similar structure to the zone 00.

In some embodiments, as represented by diagonal shading of certain SPAD cells in FIG. 5A, each of the macroblocks comprises at least some SPAD cells having a reduced sensitivity.

For example, each of the SPAD cells shown with shading from bottom right to top left has a light shield formed over it, the shield having an aperture allowing only a certain percentage of the light arriving at the cell from the image scene to fall on the photosensitive region of the SPAD cell. For example, the aperture of each of these SPAD cells allows between 50 and 90 percent of the light to pass through to the SPAD cell. Each of the SPAD cells shown with shading from bottom left to top right for example has a light shield formed over it, the shield having an aperture allowing an even lower percentage of light arriving at the cell from the image scene to fall on the photosensitive region of the SPAD cell. For example, the aperture of each of these SPAD cells allows between 30 and 70 percent of the light to pass through to the SPAD cell.

The SPAD cells having reduced sensitivity are for example formed as described in more detail in the French patent application N° FR15/52385 corresponds to U.S. Pat. No. 9,786,701), which is hereby incorporated by reference herein in its entirety to the extent that its disclosure is not inconsistent with the teachings and definitions provided herein.

The 16 SPAD cells of each macroblock for example have their outputs coupled to an OR gate 501-0 to 501-8 respectively associated with the nine macroblocks of the zone. The OR gates 501-0 to 501-8 each combine the outputs in the SPAD cells of the corresponding macroblock onto a single output line of the macroblock, respectively labeled MB0 to MB8 in FIG. 5A. The 9 macroblock outputs MB0 to MB8 are for example brought to an edge of the array, where they are coupled to the range estimation circuit RANGING 00 associated with the zone 00, for example via an OR tree 502, which combines the 9 signals into a single signal. Furthermore, a selection block 503 of the selection circuit 406 is for example coupled between the macroblock outputs and the OR tree 502.

Each of the nine macroblock output lines of the zone 00 is also for example coupled to a corresponding counter of the counter circuit 402. The nine counters associated with the zone 00 are labeled COUNTER0 to COUNTER8 in FIG. 5A. In some embodiments, each of the counters counts the events detected by the SPAD cells of the corresponding macroblock during a common count window of all of the counters. In other words, all of the counters are for example enabled during the common count window to count the detected events. For example, this common count window has a duration in the range 5 to 20 ms, and for example equal to around 10 ms.

An output line of each counter COUNTER0 to COUNTER8 is for example coupled to a multiplexer 504 adapted to select the count values from each counter in turn to be transmitted on output lines 506 for storage in a memory (SRAM) 508. The memory 508 is for example an SRAM (static random access memory). The count values are for example each n+1 bits in length, where n is for example equal to between 3 and 15.

Write addresses for storing the data values in the memory 508 are for example provided by a finite state machine (FSM) 510. The FSM 510 also for example provides a selection signal (SELECT) on a line 512 to the multiplexer 504.

The multiplexer 504 also for example receives the outputs of other counters of the counter circuit, which are for example coupled to the macroblocks of other zones of the array. For example, the counter circuit 402 of FIG. 4 comprises a total of 81 counters.

Figure 5B:
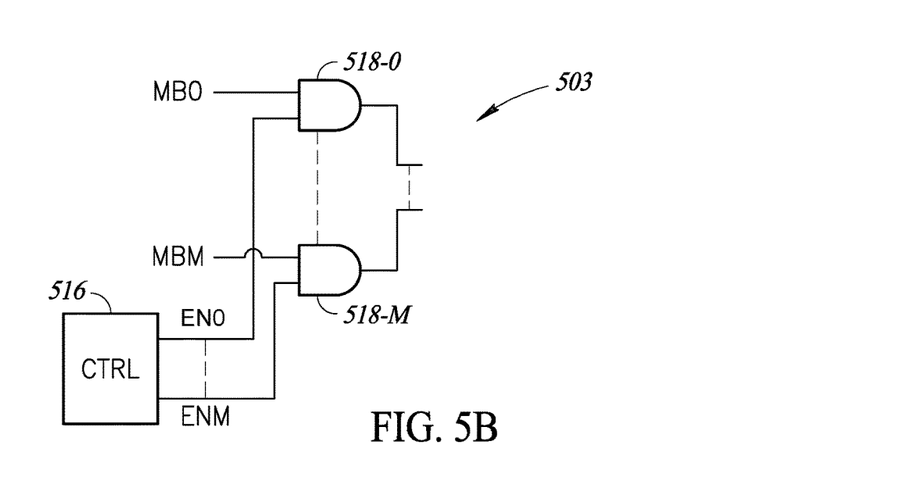
FIG. 5B schematically illustrates a selection circuit of FIG. 5A in more detail according to an example embodiment.

FIG. 5B schematically illustrates the selection block 503 of FIG. 5A in more detail according to an example embodiment. The selection block 503 for example comprises a control block (CTRL) 516 forming part of the control circuit 404 of FIG. 4, and adapted to generate enable signals EN0 to ENm, where m+1 is the number of macroblocks in the zone. Each of the enable signals is coupled to one input of corresponding AND gate 518-0 to 518-m. The other inputs of the AND gates 518-0 to 518-m are respectively coupled to output signals MB0 to MBm of the corresponding macroblocks. The outputs of the AND gates 518-0 to 518-m are coupled to the inputs of the OR tree 502 of FIG. 5A. A similar circuit is for example provided for each of the other zones of the array.

Figure 6:
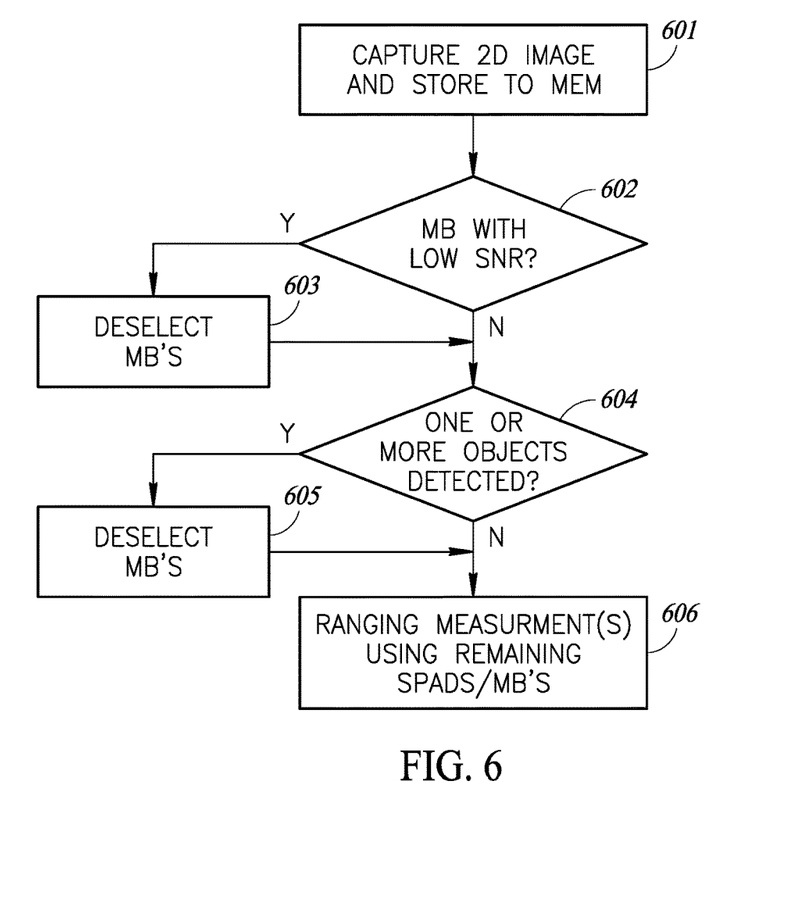
FIG. 6 is a flow diagram illustrating steps in a method of detecting the range of one or more objects in an image scene according to an example embodiment.

FIG. 6 is a flow diagram illustrating operations in a method of estimating the distance to one or more objects in an image scene. This method is for example performed at least partially by the control circuit 404 of FIG. 4.

In an operation 601, a 2D image of the image scene is captured using the SPAD array. For example, the counters of the counter circuit 402 of FIG. 4 are adapted to count photon detection events for each macroblock of the array during a detection window while one or more optical pulses are transmitted into the image scene. The count values generated by each of the counters are then for example stored to a memory.

In an operation 602, it is determined, for example by the control circuit 404, whether the output of one or more macroblocks has a low signal-to-noise ratio (SNR). For example, the count value forming each pixel of the 2D image is compared to a threshold level $S_{th}$, and if it is below the threshold level, the corresponding macroblock is considered to have a low SNR. Additionally or alternatively, the detected values may be compared to ambient levels in order to calculate the SNR. For example, the outputs of the macroblocks are captured while optical pulses are being transmitted into the image scene in order to generate a signal map, representing the image scene with the presence of the optical signal. An ambient map is also for example captured while optical pulses are not being transmitted into the image scene, the signal VCSEL for example being OFF. By comparing, for each macroblock, the level captured in the signal map with the level captured in the ambient map, the SNR can be determined. For example, the SNR for a macroblock i is equal to $V_{SMi}/V_{AMi}$, where $V_{SMi}$ is the level of macroblock i in the signal map, and $V_{AMi}$ is the level of the macroblock i in the ambient map. This SNR is for example compared to a threshold $SNR_{th}$, and if it is lower than this threshold, the macroblock is considered to have a low SNR. In some embodiments, a macroblock is determined to have a low SNR if either the captured signal level is below the threshold $S_{th}$ or the SNR is below the threshold $SNR_{th}$.

If one or more macroblocks having a low SNR is identified, these macroblocks are deselected in an operation 603, for example by the circuit 503 of FIG. 5B.

In an operation 604, it is for example determined whether one or more objects are detected in the 2D image. This step can optionally be performed in order to implement object tracking in relation to one or more objects in the image scene. For example, an object is detected if there is a high counter rate in the corresponding macroblock. If so, in an operation 605, one or more further macroblocks are deselected, again for example using the circuit 503 of FIG. 5B. For example, all macroblocks are deselected except those in which objects are detected, and for which the SNR is above the threshold level. In some embodiments, the ranging device has a maximum range limit determined by the intensity of the optical pulses, and thus the only objects detected in the image scene will be those within the maximum range limit.

Additionally or alternatively, 2D object tracking can be based on the selection process of operations 602 and 603. Indeed, zones of reasonably high signal levels and/or high SNR levels can be considered to correspond to zones in which objects are likely to be present.

In an operation 606, one or more ranging measurements are for example performed based on the remaining selected macroblocks, using the corresponding range estimation circuits. The operations 601 to 606 may be repeated periodically, for example every few milliseconds, in order to perform object tracking, the range and position of the object being tracked by the 2D image and the range estimation of identified objects.

In some embodiments, rather than each of the range estimation circuits comprising a single counter stage formed by the counters 206, 208 of FIG. 2, congestion in the OR tree 502 can be reduced by providing more than one counter stage in each range estimation circuit, as will now be described with reference to FIG. 7.

Figure 7:
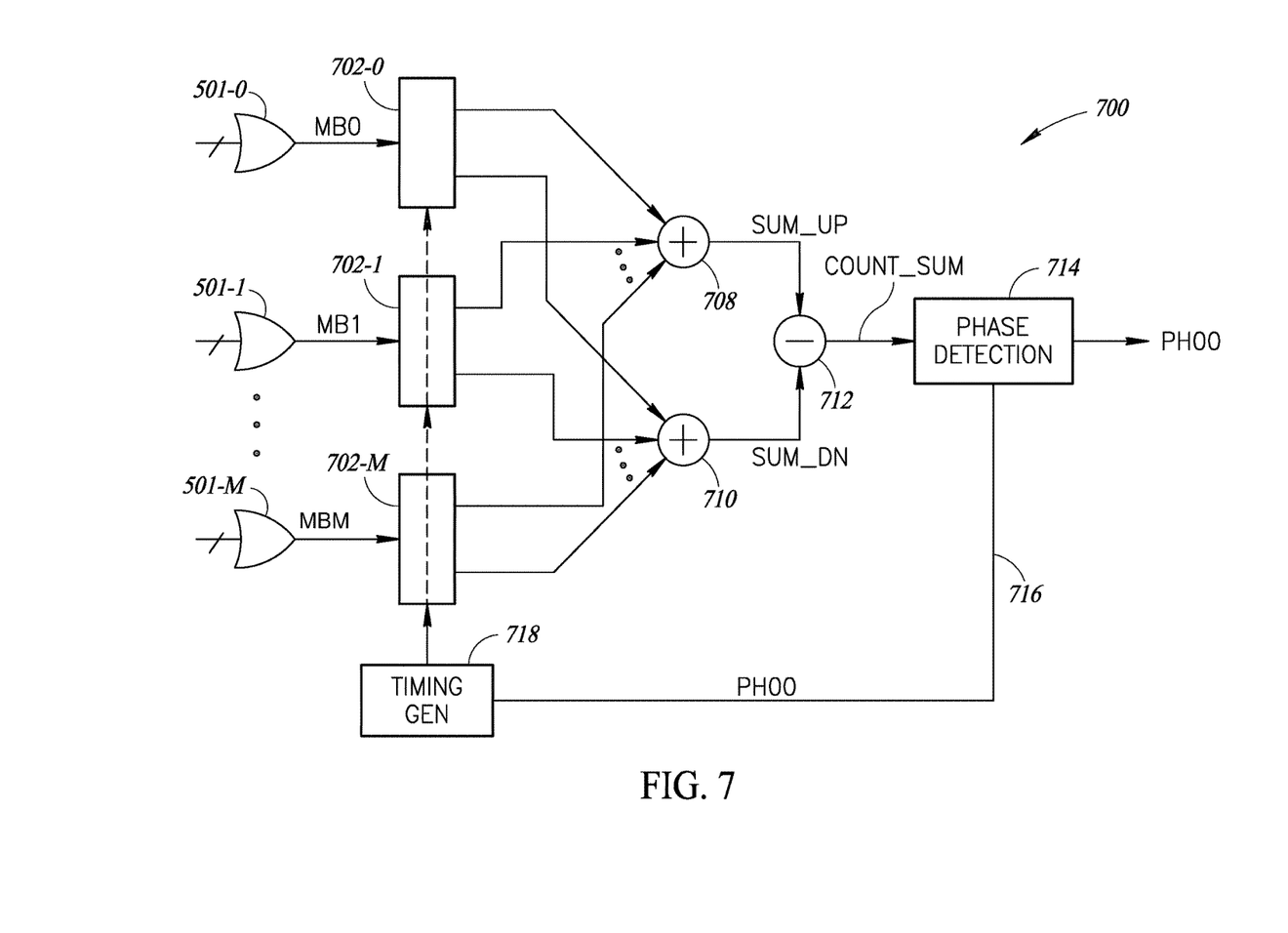
FIG. 7 schematically illustrates a read-out circuit according to a further embodiment of the present disclosure.

FIG. 7 schematically illustrates a circuit 700 forming part of the delay detection circuit 114 of FIG. 1 according to an alternative embodiment to the circuit 200 of FIG. 2.

The circuit 700 comprises counter circuits 702-0 to 702-m respectively coupled to receive the signals MB0 to MBm at the respective outputs of the OR trees 501-0 to 501-m of the macroblocks of the zone 00. Each of the counter circuits 702-0 to 702-m is adapted to count, during down and up periods DN, UP, the photon detection events generated by the photon detection devices to which it is coupled via the corresponding OR tree. The resulting up count values from each counter circuit 702-0 to 702-m are provided to an adder 708, which adds the count values to generate a sum SUM_UP. Similarly, the down count values from each counter circuit 702-0 to 702-m are provided to an adder 710, which adds the count values to generate a sum SUM_DN. A subtractor 712 for example determines the difference COUNT_SUM between the DN and UP count values.

The difference COUNT_SUM is provided to a phase detection circuit (PHASE DETECTION) 714. Like the phase detection circuit 218 of FIG. 2, the phase detection circuit 714 is for example a sigma delta phase detector. The circuit 714 generates, based on the signal COUNT_SUM, the phase signal PH00 indicating the timing of the center of each optical pulse received by the zone 00 of the target SPAD array 110. As represented by the feedback line 716, the phase signal PH00 generated by the circuit 714 is also for example transmitted to a timing generation circuit (TIMING GEN) 718, which generates control signals for controlling the timing of the counter circuits 702-0 to 702-m based on the phase signal PH00.

An advantage of the embodiments described herein is that, by providing counters for generating a 2D image based on events detected across the SPAD array, the SNR of the SPAD array can be improved by deselecting SPAD cells or macroblocks of SPAD cells for which the SNR is poor. Furthermore, object tracking can be performed.

Having thus described at least one illustrative embodiment, various alterations, modifications and improvements will readily occur to those skilled in the art. For example, while example embodiments are described in which are a plurality of range estimation circuits, in alternative embodiments there could be a single range estimation circuit. Furthermore, while embodiments are described in which some SPAD cells of the array have reduced sensitivity with respect to other SPAD cells, in alternative embodiments, all of the SPAD cell may have the same sensitivity.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A ranging device comprising:
an array of photon detection devices adapted to receive an optical signal reflected by an object in an image scene;
a first logic device adapted to combine the outputs of a first plurality of the photon detection devices;
a second logic device adapted to combine the outputs of a second plurality of the photon detection devices;
a first range detection circuit coupled to outputs of the first and second logic devices;
a first counter coupled to the output of the first logic device and adapted to generate a first pixel value by counting events generated by the first plurality of photon detection devices; and
a second counter coupled to the output of the second logic device and adapted to generate a second pixel value by counting events generated by the second plurality of photon detection devices.

2. The ranging device of claim 1, further comprising a control circuit adapted to select or deselect the output of the first logic device based on the first pixel value and to select or deselect the output of the second logic device based on the second pixel value.

3. The ranging device of claim 2, wherein the control circuit is adapted to compare the first pixel value with a first threshold level and to deselect the output of the first logic device if the first pixel value is lower than the first threshold level.

4. The ranging device of claim 2, wherein the first counter is adapted to:
generate the first pixel value by counting events while the optical signal is transmitted into the image scene;
generate a first ambient pixel value by counting events generated by the first plurality of photon detection devices while no optical signal is transmitted into the image scene; and
generate a first signal to noise ratio based on the first pixel value and on the first ambient pixel value, and deselect the output of the first logic device if the first signal to noise ratio is lower than a second threshold level.

5. The ranging device of claim 1, wherein the first and second plurality of photon detection devices are part of a first zone of the array, the array further comprising a second zone, the ranging device further comprising:
a third logic device adapted to combine the outputs of a third plurality of photon detection devices of said second zone; and
a second range detection circuit coupled to an output of the third logic device.

6. The ranging device of claim 1, wherein the first range detection circuit comprises:
- a first counter circuit coupled to an output of the first logic device and adapted to generate a first count value by counting the photon detection events generated by the first plurality of photon detection devices;
- a second counter circuit coupled to an output of the second logic device and adapted to generate a second count value by counting the photon detection events generated by the second plurality of photon detection devices; and
- a range estimation circuit adapted to estimate the range of the object by estimating the timing of one or more pulses of said optical signal based on the first and second count values.

7. The ranging device of claim 6, wherein:
the first counter circuit is adapted to generate the first count value by counting the photon detection events generated by the first plurality of photon detection devices during a first time window, and to generate a third count value by counting the photon detection events generated by the first plurality of photon detection devices during a second time window consecutive to the first time window; and
the second counter circuit is adapted to generate the second count value by counting the photon detection events generated by the second plurality of photon detection devices during the first time window and to generate a fourth count value by counting the photon detection events generated by the second plurality of photon detection devices during the second time window.

8. The ranging device of claim 7, further comprising:
- a first adder adapted to add the first and second count values to generate a first combined count value; and
- a second adder adapted to add the third and fourth count values to generate a second combined count value, wherein the first range detection circuit is adapted to determine the timing of the one or more pulses of said optical signal based on the first and second combined count values.

9. The ranging device of claim 8, wherein the first range detection circuit is adapted to calculate the difference between the first and second combined count values, and to determine the timing of the one or more optical pulses based on said difference.

10. The ranging device of claim 6, wherein the first range estimation circuit comprises a sigma-delta phase detector.

11. The ranging device of claim 1, further comprising:
an optical transmitter adapted to transmit the optical signal towards the object in the image scene.

12. The ranging device of claim 1, wherein the first and second logic devices are OR trees.

13. The ranging device of claim 1, wherein the photon detection devices are SPAD (single-photon avalanche diode) devices.

14. A method comprising:
receiving, by an array of photon detection devices, an optical signal reflected by an object in an image scene;
combining, by a first logic device, the outputs of a first plurality of the photon detection devices;
combining, by a second logic device, the outputs of a second plurality of the photon detection devices;
generating, by a first counter coupled to the output of the first logic device, a first pixel value by counting events generated by the first plurality of photon detection devices;
generating, by a second counter coupled to the output of the second logic device, a second pixel value by counting events generated by the second plurality of photon detection devices; and
estimating, by a first range detection circuit coupled to outputs of the first and second logic devices, a range of the object.

15. The method of claim 14, further comprising:
selecting or deselecting, by a control circuit, the output of the first logic device based on the first pixel value; and
selecting or deselecting, by the control circuit, the output of the second logic device based on the second pixel value.

16. The method of claim 14, wherein the optical signal is:
a square-wave signal; or
a sinewave signal; or
a triangle wave signal; or
a sawtooth wave signal.

17. A method comprising:
transmitting an optical signal towards an object in an image scene;
detecting a portion of the optical signal reflected by the object with an array of photon detection cells, each photon detection cell generating an output indicating whether the portion of the optical signal reflected by the object has been detected;
combining the outputs of groups of the photon detection cells to generate a corresponding event associated with each group of photon detection cells, each event indicating whether the portion of the optical signal reflected by the object has been detected by any of the photon detection cells in the group;
counting events generated by each of the groups of photon detection cells;
generating a respective pixel value for each group of photon detection cells based on the counting of events for the group of photon detection cells;
estimating a range of the object based on at least some of the generated respective pixel values.

18. The method of claim 17, wherein combining the outputs comprises performing an OR logic function of the outputs of each group of photon detection cells to generate the corresponding event.

19. The method of claim 17 further comprising:
terminating the transmitting of the optical signal towards the object in the image scene;
generating ambient pixel values for each group of photon detection cells by counting events for each of the groups of photon detection cells while the transmitting of the optical signal is terminated;
generating a signal-to-noise ratio for each group of photon detection cells based on the corresponding respective value and ambient pixel value;
utilizing the respective pixel value of each group of photon detection cells in estimating the range of the object if the signal-to-noise ratio of the group exceeds a threshold; and
deselecting each group of photon detection cells if the signal-to-noise ratio of the group does not exceed the threshold so the respective pixel value of the group is not utilized in estimating the range of the object.

20. The method of claim 17, wherein detecting a portion of the optical signal reflected by the object with the array of photon detection cells comprises shielding selected ones of the photon detection cells in each group to control a percentage of the portion of the optical signal reflected by the object that reaches each shielded photon detection cell in the group.

* * * * *